United States Patent
Lee et al.

(10) Patent No.: US 11,011,732 B2
(45) Date of Patent: May 18, 2021

(54) ORGANIC LIGHT EMITTING DIODE DISPLAY DEVICE

(71) Applicant: LG Display Co., Ltd., Seoul (KR)

(72) Inventors: Kang-Ju Lee, Paju-si (KR); Keum-Kyu Min, Paju-si (KR); Soo-Kang Kim, Paju-si (KR); Jin-Tae Kim, Paju-si (KR); Yong-Hoon Choi, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 16/148,274

(22) Filed: Oct. 1, 2018

(65) Prior Publication Data
US 2019/0131578 A1 May 2, 2019

(30) Foreign Application Priority Data
Oct. 31, 2017 (KR) .................. 10-2017-0144069

(51) Int. Cl.
*H01L 51/52* (2006.01)
*H01L 27/32* (2006.01)

(52) U.S. Cl.
CPC ...... *H01L 51/5271* (2013.01); *H01L 27/3258* (2013.01); *H01L 27/3276* (2013.01); *H01L 27/322* (2013.01); *H01L 27/3246* (2013.01); *H01L 27/3279* (2013.01); *H01L 51/525* (2013.01)

(58) Field of Classification Search
CPC ............ H01L 51/5271; H01L 27/3276; H01L 27/3258; H01L 27/3246; H01L 27/322; H01L 51/525; H01L 27/3279
See application file for complete search history.

(56) References Cited

U.S. PATENT DOCUMENTS

| | | |
|---|---|---|
| 2002/0101152 A1 | 8/2002 | Kimura |
| 2004/0263062 A1 | 12/2004 | Fujii |
| 2008/0253132 A1 | 10/2008 | Urabe et al. |
| 2013/0214301 A1 | 8/2013 | Yamada et al. |
| 2014/0124749 A1* | 5/2014 | Kim ............... H01L 27/322 257/40 |
| 2016/0372528 A1* | 12/2016 | Kamura ............ H01L 51/5284 |

FOREIGN PATENT DOCUMENTS

| | | |
|---|---|---|
| CN | 102749674 A | 10/2012 |
| CN | 102969458 A | 3/2013 |
| CN | 103258838 A | 8/2013 |
| CN | 105932040 A | 9/2016 |
| JP | 2008210728 A | 9/2008 |
| WO | 2019041899 A1 | 3/2019 |

* cited by examiner

*Primary Examiner* — Patricia D Reddington
(74) *Attorney, Agent, or Firm* — Seed IP Law Group LLP

(57) ABSTRACT

An organic light emitting diode display device includes a substrate having a plurality of subpixels which each have an emission region and a non-emission region defined along an edge of the emission region. A reflective barrier is disposed to correspond to the non-emission region and includes a reflective side surface. An overcoat layer is disposed on an upper portion of the reflective barrier. A light emitting diode includes a first electrode, an organic light emitting layer, and a second electrode, which are sequentially disposed on the overcoat layer. The reflective side surface of the reflective barrier is inversely tapered such that a width thereof is decreased in a traveling direction of light emitted from the organic light emitting layer.

10 Claims, 10 Drawing Sheets

ORGANIC LIGHT EMITTING DIODE DISPLAY DEVICE

CROSS-REFERENCE TO RELATED APPLICATIONS

This application claims the benefit under 35 U.S.C. § 119(a) of Korean Patent Application No. 2017-0144069, filed on Oct. 31, 2017, in the Korean Intellectual Property Office, which is incorporated herein by reference in its entirety.

BACKGROUND

Technical Field

The present disclosure relates to an organic light emitting diode display device, and more particularly, to an organic light emitting diode display device having improved light extraction efficiency.

Description of the Related Art

Recently, with the advent of an information-oriented society, as interest in information displays for processing and displaying a massive amount of information and demand for portable information media have increased, a display field has rapidly advanced. Thus, various light and thin flat panel display devices have been developed and highlighted.

As specific examples of the flat display devices, there are a liquid crystal display (LCD) device, a plasma display panel (PDP) device, a field emission display (FED) device, an electroluminescence display (ELD) device, an organic light emitting diode (OLED) display device, and the like. The flat display devices exhibit excellent characteristics in terms of thinning, lightening, and reductions in the power consumption thereof and thus have rapidly replaced the conventional cathode ray tube (CRT) displays.

Among the flat panel display devices, the OLED display device is an emissive type device and does not require a backlight unit used in a non-emissive type device, i.e., the LCD device. As a result, the OLED display device has light weight and a thin profile.

In addition, the OLED display device has advantages of a viewing angle, a contrast ratio, and power consumption as compared with the LCD device. Furthermore, the OLED display device may be driven with a low direct current (DC) voltage and has rapid response speed. Moreover, since inner elements of the OLED display device have a solid phase, the OLED display device has high durability against an external impact and has a wide available temperature range.

Specifically, since the OLED display device is manufactured through a simple process, manufacturing costs may be reduced as compared with the conventional LCD device.

The OLED display device is an emissive type device emitting light through a light emitting diode (LED). The LED emits light through an organic electroluminescence phenomenon.

FIG. 1 is a band diagram illustrating an LED having an emission principle based on a general organic electroluminescence phenomenon.

As shown, an LED 10 includes an anode 21, a cathode 25, and an organic light emitting layer disposed between the anode 21 and the cathode 25. The organic light emitting layer includes a hole transport layer (HTL) 33, an electron transport layer (ETL) 35, and an emission material layer (EML) 40 interposed between the HTL 33 and the ETL 35.

In order to improve luminous efficiency, a hole injection layer (HIL) 37 is interposed between the anode 21 and the HTL 33, and an electron injection layer (EIL) 39 is interposed between the cathode 25 and the ETL 35.

In the LED 10, when positive and negative voltages are respectively applied to the anode 21 and the cathode 25, holes of the anode 21 and electrons of the cathode 25 are transported to the EML 40 to form excitons. When the excitons transit from an excited state to a ground state, light is generated and emitted in the form of visible light by the EML 40.

However, in an OLED display device including the LED 10, while light emitted from the organic light emitting layer passes through various components and is emitted to the outside, a large portion of the light is lost. Thus, light emitted to the outside of the OLED display device is only about 20% of the light emitted from the organic light emitting layer.

Here, since an amount of the light emitted from the organic light emitting layer is increased along with an amount of a current applied to the OLED display device, it is possible to further increase brightness of the OLED display device by applying more currents to the organic light emitting layer. However, in this case, power consumption is increased, and lifetime of the OLED display device is also reduced.

Therefore, there is a need for various research to improve the light extraction efficiency of the OLED display device.

BRIEF SUMMARY

The present disclosure has been made to solve the above problems and is directed to providing an organic light emitting diode display having improved light extraction efficiency.

In addition, the present disclosure is directed to preventing light leakage.

In one embodiment, the present disclosure provides an organic light emitting diode display device including: a substrate having a plurality of subpixels which each have an emission region and a non-emission region defined along an edge of the emission region; a reflective barrier disposed to correspond to the non-emission region and including a reflective side surface; an overcoat layer disposed on an upper portion of the reflective barrier; and a light emitting diode including a first electrode, an organic light emitting layer, and a second electrode, which are sequentially disposed on the overcoat layer, wherein the reflective side surface of the reflective barrier is inversely tapered such that a width thereof is decreased in a traveling direction of light emitted from the organic light emitting layer.

BRIEF DESCRIPTION OF THE SEVERAL VIEWS OF THE DRAWINGS

The accompanying drawings, which are included to provide a further understanding of the disclosure, are incorporated in and constitute a part of this specification, illustrate implementations of the disclosure and together with the description serve to explain the principles of embodiments of the disclosure.

DETAILED DESCRIPTION

Hereinafter, embodiments according to the present disclosure will be described in detail with reference to the drawings.

Figure 1:
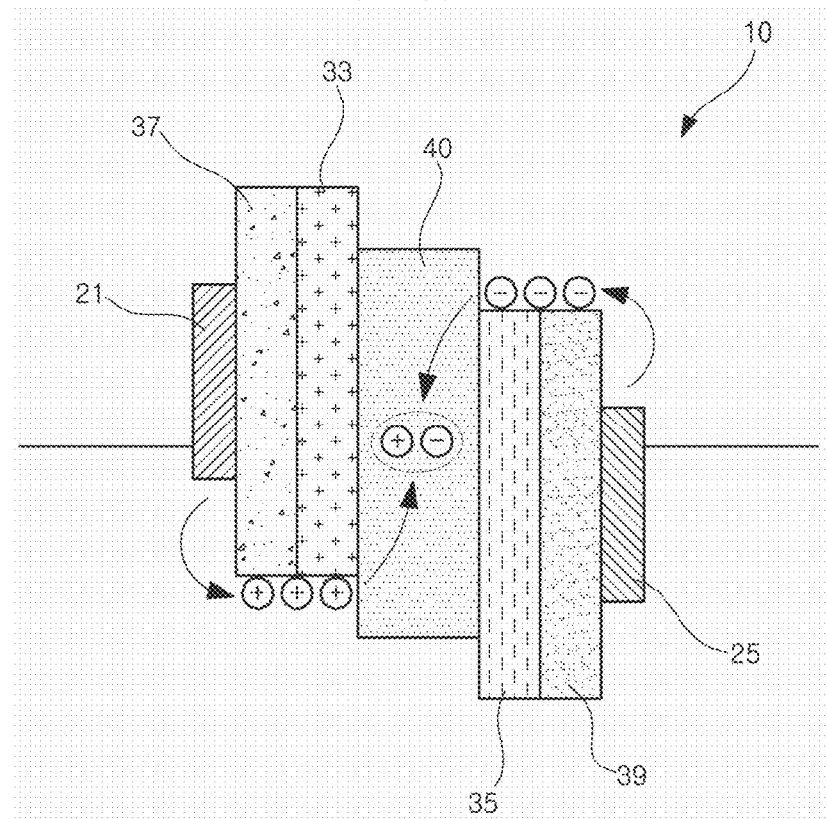
FIG. 1 is a band diagram illustrating a light emitting diode (LED) having an emission principle based on an organic electroluminescence phenomenon according to the related art.
Figure 2:
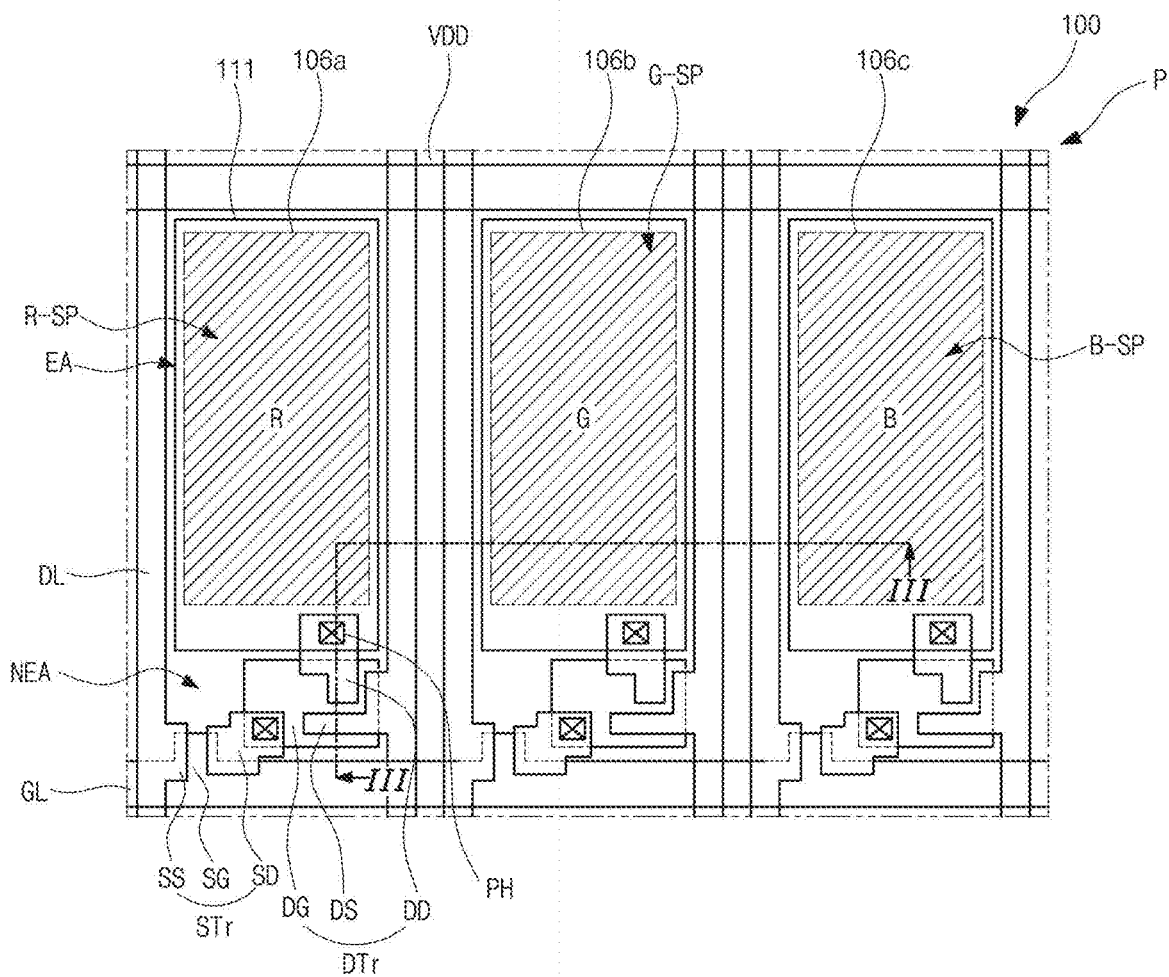
FIG. 2 is a plan view illustrating a structure of one unit pixel including three subpixels in an organic light emitting diode (OLED) display device according to an embodiment of the present disclosure.

FIG. 2 is a plan view illustrating a structure of one unit pixel including three subpixels in an organic light emitting diode (OLED) display device according to an embodiment of the present disclosure.

Figure 3:
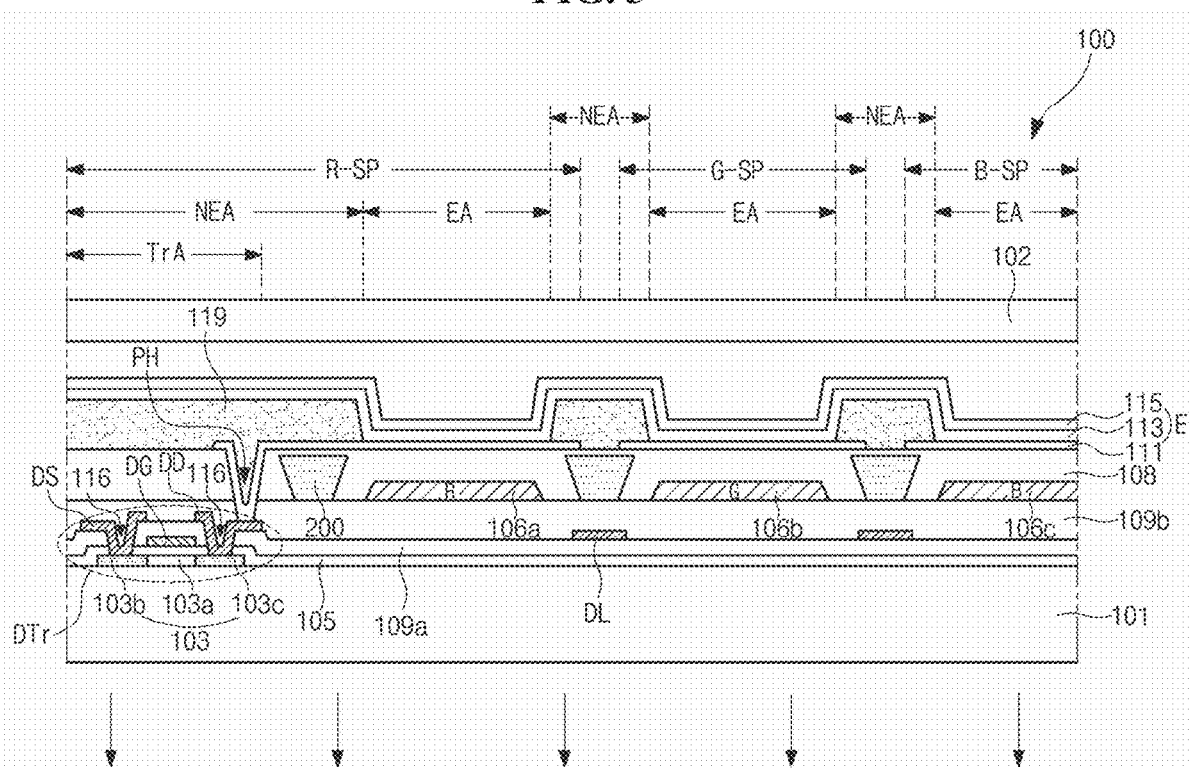
FIG. 3 is a cross-sectional view taken along line III-III of FIG. 2 illustrating a structure of one unit pixel P including three subpixels in the OLED display device according to an embodiment of the present disclosure.

FIG. 3 is a cross-sectional view taken along line III-III of FIG. 2, illustrating a structure of one unit pixel P including three subpixels R-SP, G-SP, and B-SP in the OLED display device according to the embodiment of the present disclosure.

Prior to the description, an OLED display device 100 according to an embodiment of the present disclosure is classified into a top emission type or a bottom emission type according to a transmission direction of emitted light. Hereinafter, the bottom emission type will be described as an example in the present disclosure.

As shown in FIG. 2, in the OLED display device 100 according to the embodiment of the present disclosure, one unit pixel P includes red, green, and blue subpixels R-SP, G-SP, and B-SP. Each of the subpixels R-SP, G-SP, and B-SP includes an emission region EA. A bank 119 is disposed along an edge of the emission region EA to constitute a non-emission region NEA.

Here, for the convenience of description, the subpixels R-SP, G-SP, and B-SP are illustrated as having the same width and being disposed in parallel to each other. However, the subpixels R-SP, G-SP, and B-SP may have different widths and various structures.

In this case, switching and driving thin film transistors STr and DTr are provided in the non-emission region NEA of each of the subpixels R-SP, G-SP, and B-SP. A light emitting diode (LED) E including a first electrode 111, an organic light emitting layer 113, and a second electrode 115 are disposed in the emission region EA in each of the subpixels R-SP, G-SP, and B-SP.

Here, the switching thin film transistor STr and the driving thin film transistor DTr are connected to each other, and the driving thin film transistor DTr is connected to the LED E.

More specifically, gate lines GL, data lines DL, and power lines VDD are disposed on a substrate 101 to define the subpixels R-SP, G-SP, and B-SP.

The switching thin film transistor STr is formed at a portion where the gate line GL and the data line DL cross each other. The switching thin film transistor STr functions to select the subpixels R-SP, G-SP, and B-SP.

The switching thin film transistor STr includes a gate electrode SG branched from the gate line GL, a semiconductor layer 103, a source electrode SS, and a drain electrode SD.

The driving thin film transistor DTr functions to drive the LED E of each of the subpixels R-SP, G-SP, and B-SP selected by the switching thin film transistor STr. The driving thin film transistor DTr includes a gate electrode DG connected to the drain electrode SD of the switching thin film transistor STr, a semiconductor layer 103, a source electrode DS connected to the power line VDD, and a drain electrode DD.

The drain electrode DD of the driving thin film transistor DTr is connected to the first electrode 111 of the LED E.

The organic light emitting layer 113 is interposed between the first electrode 111 and the second electrode 115.

More specifically, referring to FIG. 3, the semiconductor layer 103 is disposed in a switching region TrA of each of the subpixels R-SP, G-SP, and B-SP on the substrate 101. The semiconductor layer 103 is made of silicon and has an active region 103a configured to constitute a channel and disposed at a central portion thereof, a source region 103b, and a drain region 103c, which are doped with high concentration impurities and are disposed on both side surfaces of the active region 103a.

A gate insulating film 105 is disposed on an upper portion of the semiconductor layer 103.

The gate electrode DG and a gate line GL, which is not shown in the drawings and extends in one direction, are provided on an upper portion of the gate insulating film 105 so as to correspond to the active region 103a of the semiconductor layer 103.

In addition, a first interlayer insulating film 109a is disposed on the gate electrode DG and the gate line GL. In this case, the first interlayer insulating film 109a and the gate insulating film 105 below the first interlayer insulating film 109a have first and second semiconductor layer contact holes 116 configured to respectively expose the source and drain regions 103b and 103c disposed on both side surfaces of the active region 103a.

Next, the source and drain electrodes DS and DD are spaced apart from each other on an upper portion of the first interlayer insulating film 109a having the first and second semiconductor layer contact holes 116 and are respectively in contact with the source and drain regions 103b and 103c exposed through the first and second semiconductor layer contact holes 116.

A second interlayer insulating film 109b is disposed on the upper portion of the first interlayer insulating film 109a exposed between the source and drain electrodes DS and DD.

In this case, the source and drain electrodes DS and DD, the semiconductor layer 103 having the source and drain regions 103b and 103c in contact with the source and drain electrodes DS and DD, the gate insulating film 105 disposed on the upper portion of the semiconductor layer 103, and the gate electrode DG constitute the driving thin film transistor DTr.

Although not shown in the drawings, the switching thin film transistor STr has the same structure as the driving thin film transistor DTr and is connected to the driving thin film transistor DTr.

The switching thin film transistor STr and the driving thin film transistor DTr are illustrated in the drawings as having a top gate type in which the semiconductor layer 103 is formed as a polysilicon semiconductor layer or an oxide semiconductor layer. As a modified example, the switching thin film transistor STr and the driving thin film transistor DTr may have a bottom gate type in which the semiconductor layer 103 is made of intrinsic amorphous silicon and doped amorphous silicon.

In this case, when the semiconductor layer 103 is formed as the oxide semiconductor layer, a light shielding layer (not shown) may be further disposed below the semiconductor layer 103. A buffer layer may be disposed between the light shielding layer (not shown) and the semiconductor layer 103.

In addition, each color filter 106a, 106b, and 106c are disposed on the upper portion of the second interlayer insulating film 109b corresponding to the emission region EA of each of the subpixels R-SP, G-SP, and B-SP.

The color filters 106a, 106b, and 106c are for converting a color of white light emitted from the organic light emitting layer 113. A red color filter 106a, a green color filter 106b, and a blue color filter 106c are disposed in the emission regions EA of the subpixels R-SP, G-SP, and B-SP, respectively. Since the subpixels R-SP, G-SP, and B-SP respectively emit a red color light R, a green color light G. and a blue color light B, the OLED display device 100 of the present disclosure implements a high brightness full-color display.

Here, the OLED display device 100 according to the embodiment of the present disclosure is characterized in that reflective barriers 200 are further disposed on the upper portion of the second interlayer insulating film 109b.

The reflective barrier 200 is disposed along an edge of the non-emission region NEA of each of the subpixels R-SP, G-SP, and B-SP. The reflective barrier 200 has a quadrangular frame shape corresponding to an edge of each of the subpixels R-SP, G-SP, and B-SP, and a side surface thereof has an inverse-tapered shape.

Due to the reflective barrier 200, it is possible to improve light extraction efficiency of the OLED display device 100 according to the embodiment of the present disclosure. In addition, it is possible to minimize light leakage generated due to light being reflected from an adjacent subpixel R-SP, G-SP, or B-SP.

This will be described in more detail later.

An overcoat layer 108 having a drain contact hole PH configured to expose the second interlayer insulating film 109b and the drain electrode DD of the driving thin film transistor DTr is disposed on the reflective barriers 200 and the color filters 106a, 106b, and 106c.

The first electrode 111 is disposed on an upper portion of the overcoat layer 108, the first electrode 111 being connected to the drain electrode DD of the driving thin film transistor DTr and being made of a material having a relatively high work function value to constitute an anode of the LED E.

The first electrode 111 is disposed in each of the subpixels R-SP, G-SP, and B-SP. The bank 119 may be disposed between the first electrodes 111 disposed in the subpixels R-SP, G-SP, and B-SP. That is, the first electrode 111 is separately disposed in each of the subpixels R-SP, G-SP, and B-SP due to the bank 119, which is a boundary portion of each of the subpixels R-SP, G-SP, and B-SP.

The organic light emitting layer 113 is disposed on an upper portion of the first electrode 111. A second electrode 115, which constitutes a cathode, is disposed on an entire upper surface of the organic light emitting layer 113.

In the OLED display device 100, when a certain voltage is applied to the first electrode 111 and the second electrode 115 according to a selected signal, holes injected from the first electrode 111 and electrons injected from the second electrode 115 are transported to the organic light emitting layer 113 to form excitons. When the excitons transit from an excited state to a ground state, light is generated and emitted in the form of visible light.

In this case, the emitted light passes through the transparent first electrode 111 and is emitted to the outside, so that the OLED display device 100 implements any image.

In the OLED display device 100 according to the embodiment of the present disclosure, since the reflective barrier 200 is additionally disposed along the edge of each of the subpixels R-SP, G-SP, and B-SP on the upper portion of the second interlayer insulating film 109b, it is possible to improve light extraction efficiency of the OLED display device. In addition, it is possible to minimize light leakage generated due to light being reflected from the adjacent subpixel R-SP, G-SP, or B-SP.

Figure 4:
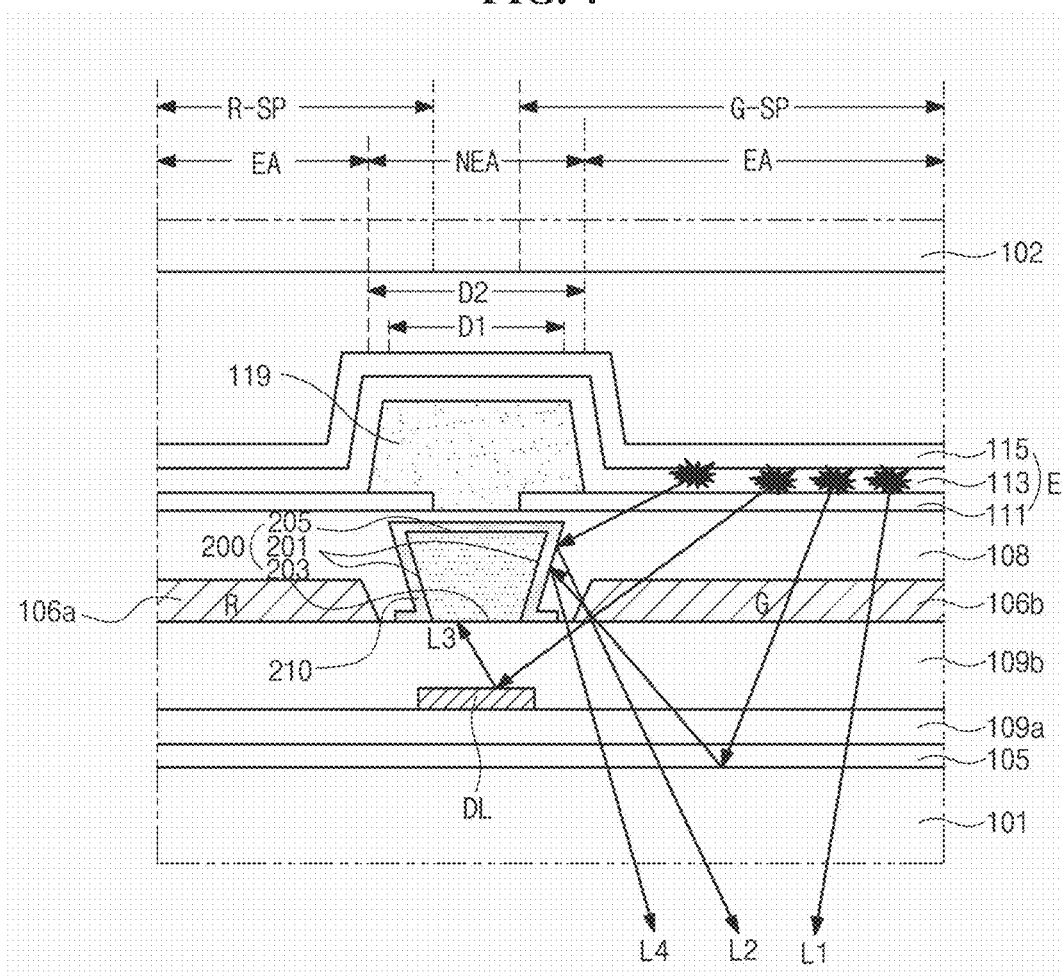
FIG. 4 is a schematic view illustrating a state in which light is guided in the OLED display device according to an embodiment of the present disclosure.

FIG. 4 is a schematic view illustrating a state in which light is guided in the OLED display device 100 according to the embodiment of the present disclosure.

As shown, the red subpixel R-SP and the green subpixel G-SP are disposed adjacent to each other on the substrate 101 with the non-emission region NEA, which is corresponding to the data line DL, interposed therebetween. The red color filter 106a is disposed on the upper portion of the second interlayer insulating film 109b in the emission region EA of the red subpixel R-SP. The green color filter 106b is disposed on the upper portion of the second interlayer insulating film 109b in the emission region EA of the green subpixel G-SP.

The reflective barrier 200 is disposed on the upper portion of the second interlayer insulating film 109b in the non-emission region NEA between the emission region EA of the red subpixel R-SP and the emission region EA of the green subpixel G-SP.

The reflective barrier 200 has both side surfaces 201 inversely tapered, a lower surface 203, and an upper surface 205, which connect the both side surfaces 201. A cross section of the reflective barrier 200 has an inverse trapezoidal shape of which a width is gradually increased moving away from the second interlayer insulating film 109b.

Meanwhile, in addition to the inverse trapezoidal shape, the cross section of the reflective barrier 200 may have any shape as long as the both side surfaces 201 have an inverse-tapered structure. In an example, the cross section of the reflective barrier 200 may have an inverse triangular shape, as shown in FIG. 5C.

In this case, when the cross section of the reflective barrier 200 has the inverse triangular shape, the lower surface 203 may be omitted.

Here, the inverse-tapered structure means that the both side surfaces 201 facing each other are inclined such that a width thereof is decreased in a travelling direction of light emitted from the organic light emitting layer 113.

The reflective barrier 200 may not require optical characteristics and thus may be made of various materials, such as photodefinable acrylic, photoresist, silicon oxide ($SiO_2$), silicon nitride ($SiN_x$), poly(methyl methacrylate) (PMMA), benzocyclobutene (BCB), polyimide, acrylate, epoxy, and polyester, but the present disclosure is not limited thereto.

The reflective barrier 200 may be made of an opaque material such as a bank material. The bank material may include an organic resin, a resin or paste including a glass paste and a black pigment, particles of metals such as nickel, aluminum, molybdenum, and alloys thereof, particles of a metal oxide (e.g., chromium oxide), or particles of a metal nitride (e.g., chromium nitride).

A reflective layer 210 is disposed on the both side surfaces 201 and the upper surface 205 of the reflective barrier 200.

The reflective layer 210 may be made of any material capable of reflecting light. The reflective layer 210 is formed by depositing at least one selected from titanium dioxide, aluminum, aluminum oxide, barium sulfate, calcium carbonate, calcium sulfate, magnesium sulfate, barium carbonate, zinc oxide, magnesium hydroxide, calcium hydroxide, and talc on the both side surfaces 201 and the upper surface 205 of the reflective barrier 200.

Therefore, the reflective barrier 200 has reflective side surfaces 201 which are inversely tapered. However, the present disclosure is not limited thereto. In one embodiment of the present disclosure, the reflective barrier 200 can be made of a material that is capable of reflecting light. In this case, the reflective layer 210 shown in FIG. 4 may be omitted, but the reflective barrier 200 still has an inversely tapered reflective side surface.

The overcoat layer 108 is disposed on the red color filter 106a, the green color filter 106b, and the reflective barrier 200. The first electrode 111 is provided in each of the subpixels R-SP and G-SP and on the upper portion of the overcoat layer 108 corresponding to the emission regions EA of the red subpixel R-SP and the green subpixel G-SP. In addition, the organic light emitting layer 113 and the second electrode 115 are sequentially stacked on the first electrode 111 to constitute the LED E.

The substrate 101, on which the LED E is formed, is encapsulated by a protective film 102.

Here, the bank 119 is disposed to correspond to the non-emission region NEA between the first electrode 111 disposed on the red subpixel R-SP and the first electrode 111 disposed on the green subpixel G-SP, and disposed on the overcoat layer 108. It is preferable that a width D2 of the bank 119 corresponding to a width of the non-emission region NFA is greater than a width D1 of an upper surface 205 of the reflective barrier 200 in the non-emission region NEA such that the reflective barrier 200 provided with the reflective layer 210 is prevented from being visible.

Here, in the OLED display device 100 (of FIG. 3) according to the embodiment of the present disclosure, since the reflective barrier 200 having the reflective side surfaces 201 inversely tapered is disposed along the edge of each of the subpixels R-SP and G-SP, light travelling to the non-emission region NEA can be extracted to the outside. Therefore, light extraction efficiency can be improved.

More specifically, since a refractive index of the organic light emitting layer 113 is substantially the same as a refractive index of the first electrode 111, an optical path of light generated in the organic light emitting layer 113 is not changed at an interface between the organic light emitting layer 113 and the first electrode 111.

The organic light emitting layer 113 and the first electrode 111 may have a refractive index of 1.7 to 2.0.

In this case, since the overcoat layer 108 has a refractive index of about 1.5, the light emitted in the organic light emitting layer 113 is totally reflected at an interface between the first electrode 111 and the overcoat layer 108. Here, among the light totally reflected at the interface between the first electrode 111 and the overcoat layer 108, some light L1 travels to the emission region EA of each of the subpixels R-SP and G-SP. However, some light L2 does not travel to the emission region EA of each of the subpixels R-SP and G-SP and travels to the non-emission region NEA disposed between the emission regions EA of the subpixels R-SP and G-Sp.

Since the light L2 traveling to the non-emission region NEA has an angle greater than a total reflection critical angle, the light L2 does not pass through the substrate 101 and is totally reflected at an interface of the substrate 101 and thus is trapped without being emitted to the outside of the substrate 101.

Here, in the OLED display 100 (of FIG. 3) according to the embodiment of the present disclosure, the light L2 traveling to the non-emission region NEA is reflected by the reflective barrier 200 and thus is extracted to the outside of the substrate 101.

That is, the reflective barrier 200 provided with the reflective layer 210 adjusts a reflection angle of incident light through the reflective side surface 201 by which the light L2 travelling to the non-emission region NEA is reflected. In this case, since the reflective side surface 201 of the reflective barrier 200 is inversely tapered, while the light L2 traveling to the non-emission region NEA is reflected by the reflective side surface 201 inversely tapered, the reflective barrier 200 prevents light having a specific angle from being totally internally reflected.

Therefore, among the light L2 travelling to the non-emission region NEA is reflected toward the emission region EA by the reflective barrier 200 which is inversely tapered. The light L2 reflected to the emission region EA is extracted to the outside of the substrate 101, thereby improving light extraction efficiency of the OLED display device 100 (of FIG. 3) according to the embodiment of the present disclosure.

That is, the light L1 and the light L2 emitted from the organic light emitting layer 113 of the green subpixel G-SP, the some light L1 travels to the emission region EA, passes through the green color filter 106b, and is emitted to the outside of the substrate 101. However, the some light L2 travels to the non-emission region NEA between the emission region EA of the green subpixel G-SP and the emission region EA of the red subpixel R-SP.

In this case, the light L2 traveling to the non-emission region NEA is reflected by the reflective side surface 201 of the reflective barrier 200, then travels to the emission region EA of the green subpixel G-SP, and is extracted to the outside of the substrate 101.

Accordingly, light extraction efficiency can be improved to improve brightness of the OLED display device 100 (of FIG. 3) and also to prevent an increase in power consumption of the OLED display device 100 (of FIG. 3).

In addition, as the light extraction efficiency is improved, lifespan of the LED E is also increased.

Furthermore, the OLED display device 100 (of FIG. 3) according to the embodiment of the present disclosure can minimize light leakage generated due to light being reflected from the adjacent subpixel R-SP or G-SP.

More specifically, some of light L3 and light L4 traveling to the substrate 101 among light emitted from the organic light emitting layer 113 is reflected by a metal line such as the data line DL provided on the substrate 101 and reaches the adjacent subpixel R-SP or G-SP. Thus, light leakage is generated.

That is, while the light L1, the light L3, and the light L4 emitted from the organic light emitting layer 113 of the green subpixel G-SP pass through the green color filter 106b and the substrate 101 and are emitted to the outside, the some light L3 or L4 is reflected by the metal line such as the data line DL and travels to the red subpixel R-SP. Thus, light leakage of green light is generated in the red subpixel R-SP.

In this case, in the OLED display device 100 (of FIG. 3) according to the embodiment of the present disclosure, since the reflective barrier 200 is disposed in the non-emission region NEA along the edge of each of the subpixels R-SP and G-SP, light is prevented from reaching the adjacent subpixel R-SP or G-SP.

Therefore, it is possible to minimize light leakage generated due to light L3 being reflected from the adjacent subpixel R-SP or G-SP.

In addition, the light L4 reflected and generated from the adjacent subpixel R-SP or G-SP is reflected and extracted to the outside, thereby further improving light extraction efficiency of the OLED display device 100 (of FIG. 3).

Figure 5A:
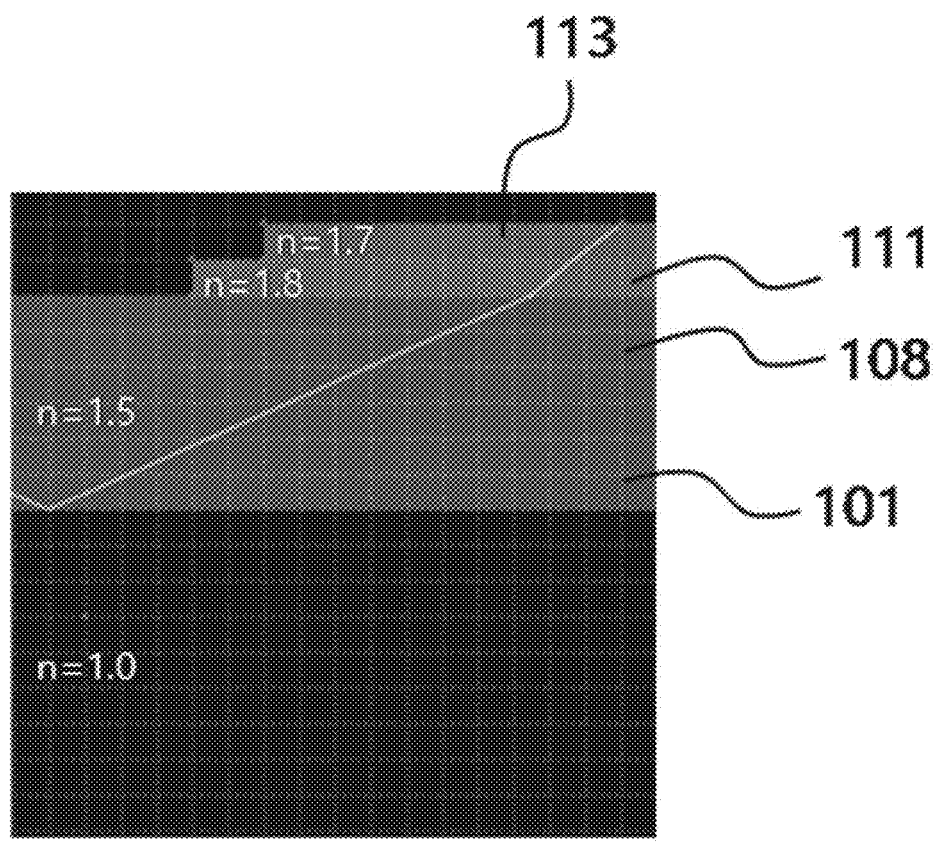
FIG. 5A illustrates a simulation result of measuring a state in which light is guided in an OLED display device not including a reflective barrier.
Figure 5B:
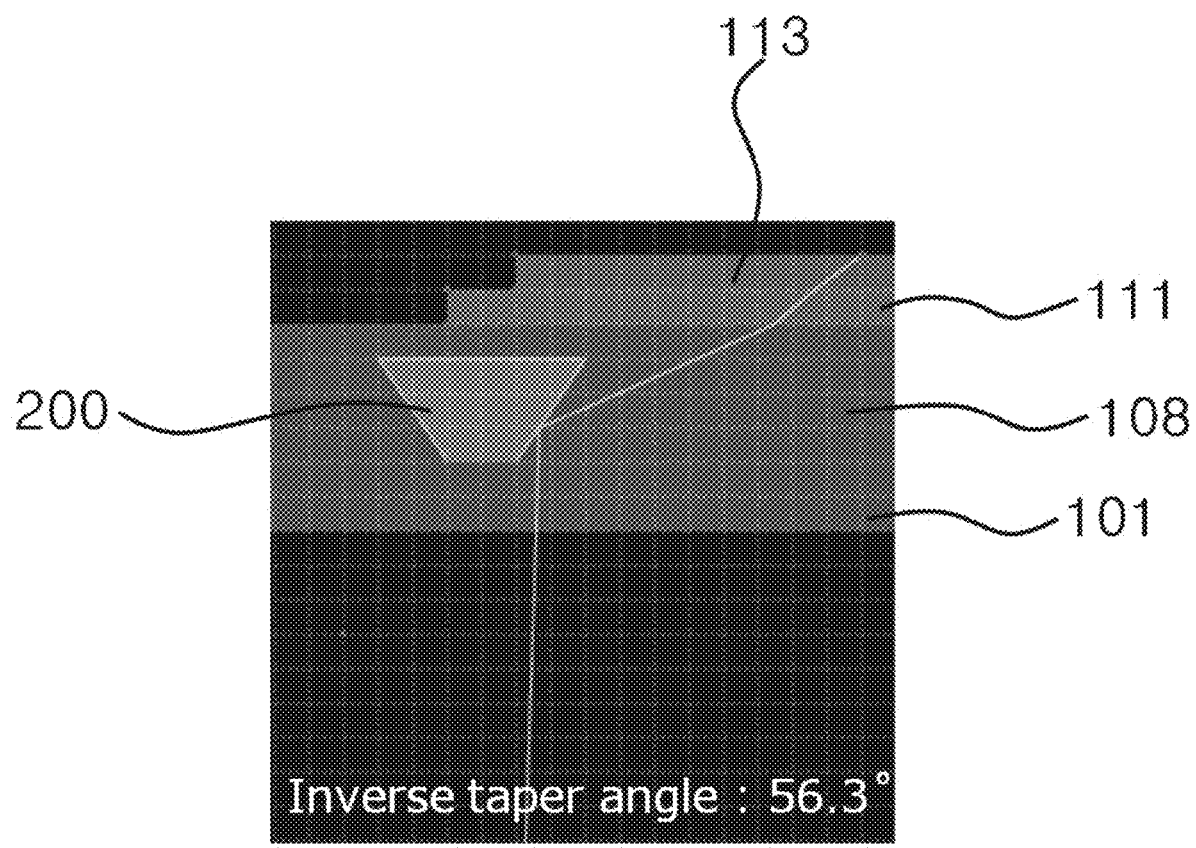
FIGS. 5B to 5E illustrate simulation results of measuring a state in which light is guided in the OLED display device including a reflective barrier according to embodiments of the present disclosure.
Figure 5C:
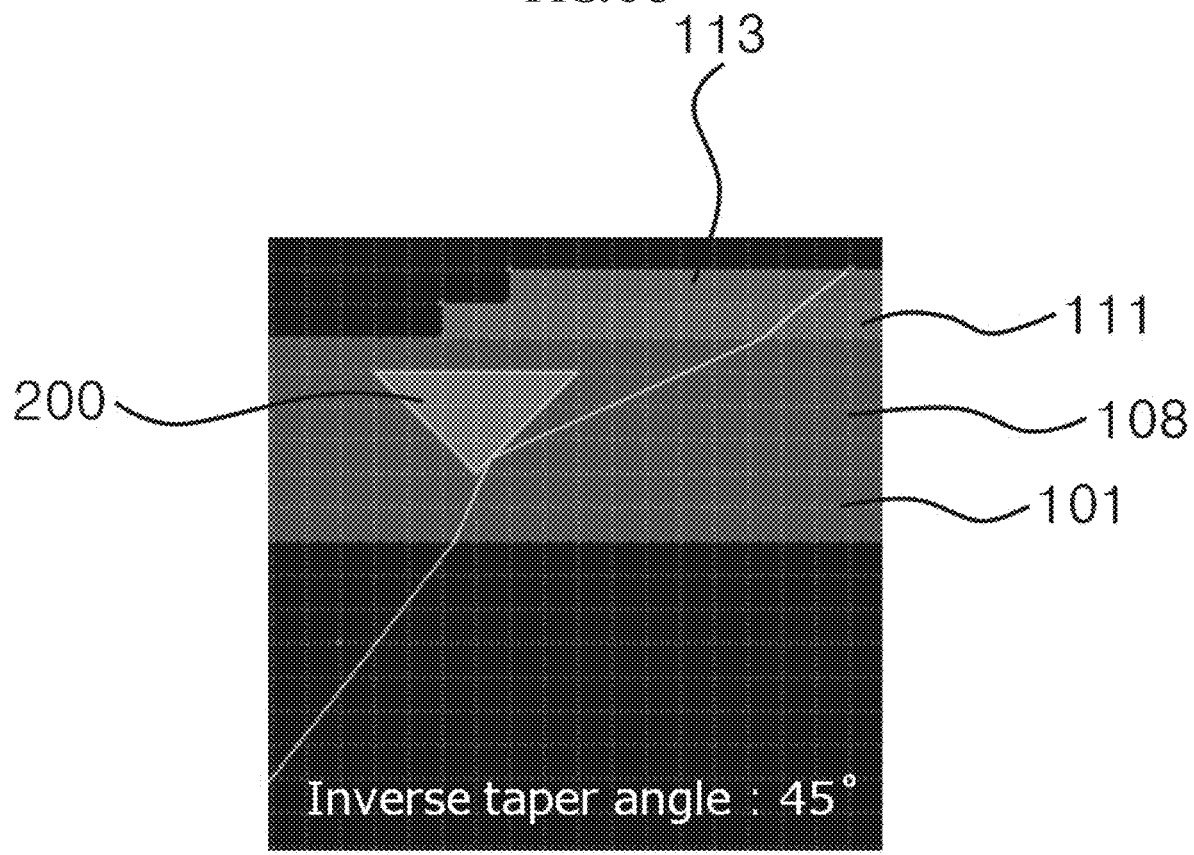

FIG. 5A illustrates a simulation result of measuring a state in which light is guided in an OLED display device not including a reflective barrier. FIG. 5B illustrates a simulation result of measuring a state in which light is guided in the OLED display device 100 including the reflective barrier 200 according to the embodiment of the present disclosure.

Figure 5D:
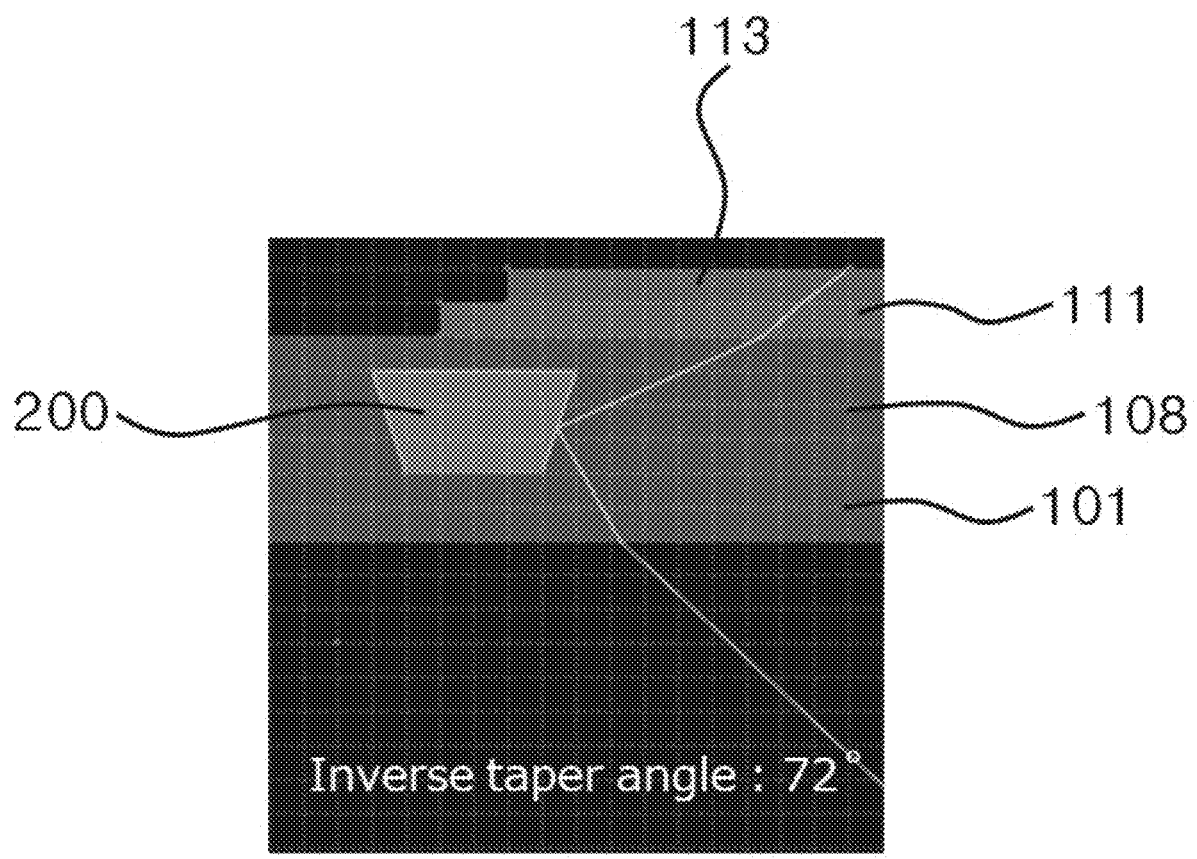
Figure 5E:
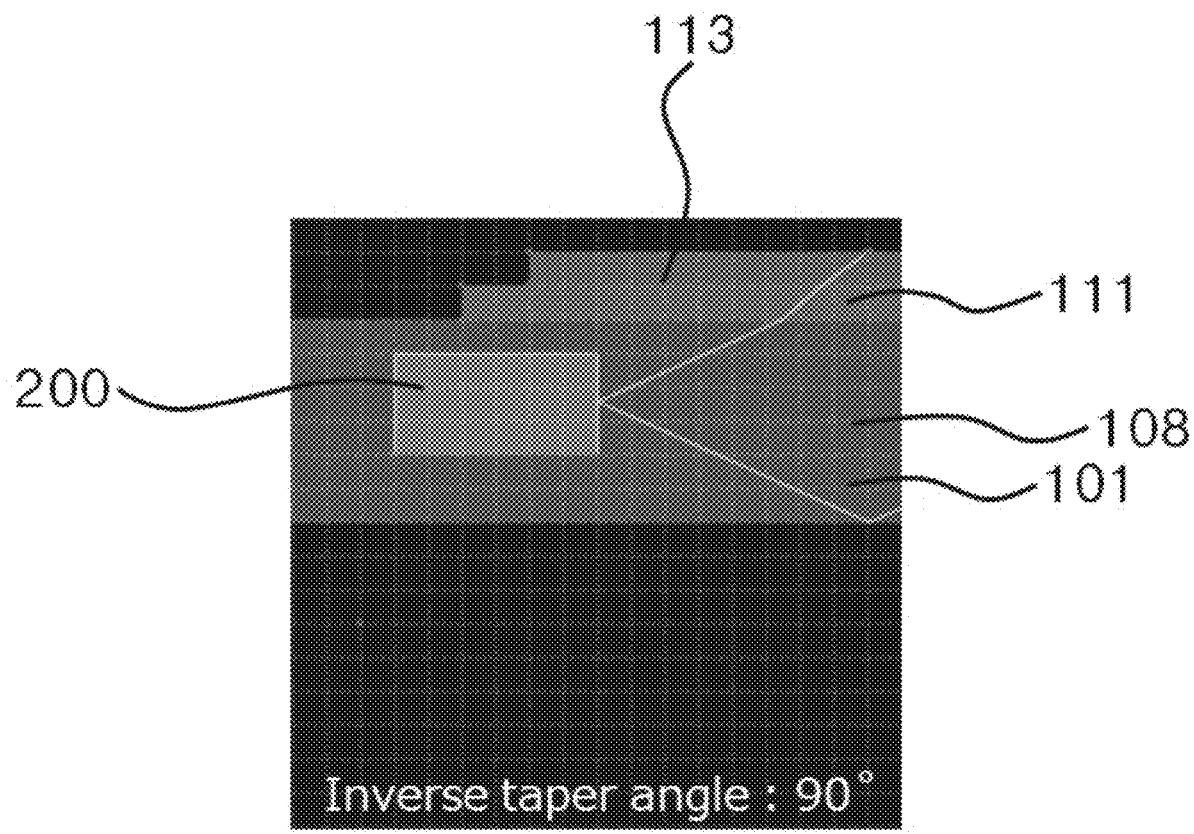
Figure 6:
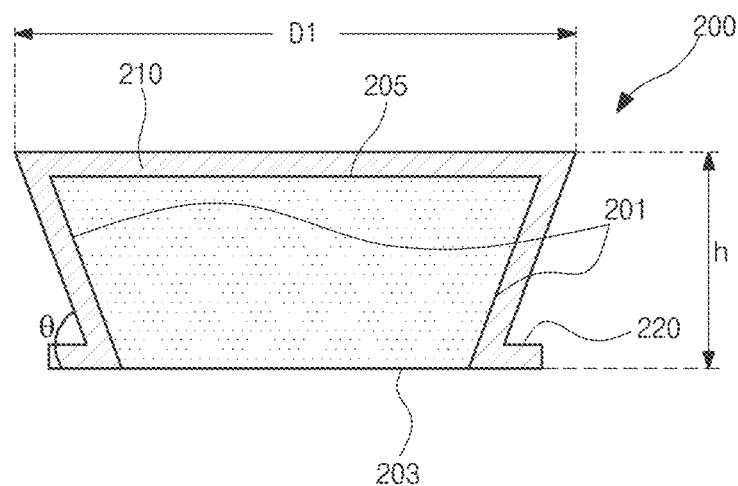
FIG. 6 is a schematic cross-sectional view illustrating a reflective barrier according to an embodiment of the present disclosure.

FIGS. 5C to 5E illustrate simulation results of measuring a state in which light is guided according to an inverse taper angle defined by the reflective side surface 201 of the reflective barrier 200. FIG. 6 is a schematic cross-sectional view illustrating the reflective barrier 200 according to the embodiment of the present disclosure.

Prior to the description, an inverse taper angle ($\Theta$) defined by the reflective side surface 201 of the reflective barrier 200 is 56.3°, the organic light emitting layer 113 and the first electrode 111 have an refractive index of 1.7 to 1.8, and the overcoat layer 108 and the substrate 101 have a refractive angle of 1.5.

Referring to FIGS. 5A and 5B, it can be confirmed that light is totally reflected at the interface between the first electrode 111 and the overcoat layer 108 and travels to the non-emission region NEA.

Here, as shown in FIG. 5A, in the OLED display device not including the reflective barrier, it can be confirmed that light traveling to the non-emission region NEA is totally reflected at a boundary of the substrate 101.

As a result, light is trapped without being emitted to the outside of the substrate 101.

On the contrary, as shown in FIG. 5B, in the OLED display device 100 (of FIG. 3) including the reflective barrier 200, it can be confirmed that light, which is totally reflected at the interface between the overcoat layer 108 and the first electrode 111 and travels to the non-emission region NEA, is reflected by the reflective side surface 201 of the reflective barrier 200 and thus is extracted to the outside of the substrate 101.

As a result, in the OLED display device 100 (of FIG. 3) according to the embodiment of the present disclosure, since the reflective barrier 200 is additionally disposed along the edge of each of the subpixels (R-SP and G-SP of FIG. 4) on the upper portion of the second interlayer insulating film (109b of FIG. 4), it can be seen that improvement of light extraction efficiency of the OLED display device 100 (of FIG. 3) is possible.

On the other hand, a state in which light is guided according to an inverse taper angle ($\Theta$) defined by the reflective side surface 201 of the reflective barrier 200 according to the embodiment of the present disclosure will be described with reference to the accompanying FIGS. 5C to 5E and FIG. 6.

Prior to the description, an inverse taper angle ($\Theta$) defined by the reflective side surface 201 of the reflective barrier 200 in FIG. 5C is 45°, an inverse taper angle ($\Theta$) defined by the reflective side surface 201 of the reflective barrier 200 in FIG. 5D is 72°, and an inverse taper angle ($\Theta$) defined by the reflective side surface 201 of the reflective barrier 200 in FIG. 5E is 90°.

Referring to FIGS. 5C to 5E and FIG. 5B, when an inverse taper angle ($\Theta$) defined by the reflective side surface 201 of the reflective barrier 200 is in a range of 45° to 72°, it can be confirmed that light reflected by the reflective barrier 200 is emitted through a side surface, as shown in FIG. 5C and FIG. 5D. When an inverse taper angle ($\Theta$) defined by the reflective side surface 201 of the reflective barrier 200 is 56.3°, it can be confirmed that light reflected by the reflective barrier 200 is emitted through a front surface, as shown in FIG. 5B.

Therefore, the inverse taper angle ($\Theta$) defined by the reflective side surface 201 of the reflective barrier 200 can be adjusted to improve brightness emitted to a front or a side of the display.

Meanwhile, referring to FIG. 5E, when an inverse taper angle ($\Theta$) defined by the reflective side surface 201 of the reflective barrier 200 is 90°, it can be confirmed that light reflected by the reflective side surface 201 of the reflective barrier 200 is totally reflected at the boundary of the substrate 101. Thus, when the inverse taper angle ($\Theta$) defined by the reflective side surface 201 of the reflective barrier 200 is 90°, light is trapped without being emitted to the outside of the substrate 101.

Therefore, it is preferable that the inverse taper angle ($\Theta$) defined by the reflective side surface 201 of the reflective barrier 200 is designed to be less than 90°.

When an inverse taper angle ($\Theta$) defined by the reflective side surface 201 of the reflective barrier 200 is 45° or less, the width D1 of the upper surface 205 of the reflective barrier 200 is increased. Thus, since it is necessary to increase a width of the non-emission region NEA in which the reflective barrier 200 is disposed, it is preferable that the inverse taper angle ($\Theta$) defined by the reflective side surface 201 of the reflective barrier 200 is greater than 45°.

As the inverse taper angle ($\Theta$) defined by the reflective side surface 201 of the reflective barrier 200 is decreased, reflection is performed near the lower surface 203 of the reflective barrier 200. Thus, in order to decrease the inverse taper angle ($\Theta$) defined by the reflective side surface 201 of the reflective barrier 200, it is necessary to increase a thickness h of the reflective barrier 200.

When the thickness h of the reflective barrier 200 is increased, a total thickness of the OLED display device 100 (of FIG. 3) is also increased. Thus, it is preferable that the inverse taper angle ($\Theta$) defined by the reflective side surface 201 is greater than 45°.

Meanwhile, a tail 220 of the reflective layer 210 is formed adjacent to the lower surface 203 in a process of depositing the reflective layer 210 provided on the both side surfaces 201 and the upper surface 205 of the reflective barrier 200. It is preferable that the tail 220 is not exposed outside the upper surface 205 of the reflective barrier 200 so as to not be visible.

Here, as the inverse taper angle ($\Theta$) defined by the reflective side surface 201 of the reflective barrier 200 is increased, the tail 220 may be exposed outside the upper surface 205 of the reflective barrier 200. Thus, it is preferable that the inverse taper angle (Θ) defined by the reflective side surface 201 of the reflective barrier 200 is an angle less than 90°, at which light can be extracted to the outside of the substrate 101, and is within a limit range in which the tail 220 of the reflective layer 210 is not exposed outside the upper surface 205 of the reflective barrier 200.

As described above, in the OLED display device 100 (of FIG. 3) according to the embodiment of the present disclosure, since the reflective barrier 200 having the reflective side surface 201 inversely tapered is disposed to correspond to the non-emitting region (NEA of FIG. 4) defined along the edge of the emission region (EA of FIG. 4) of each of the subpixels (R-SP and G-SP of FIG. 4), among the light emitted from each of the subpixels (R-SP and G-SP of FIG. 4), the light (L2 of FIG. 4) traveling to the non-emission region (NEA of FIG. 4) may be reflected and extracted to the outside of the substrate 101.

As a result, light extraction efficiency of the OLED display device 100 (of FIG. 3) is improved.

In addition, it is possible to minimize light leakage generated due to light being reflected from the adjacent subpixel (R-SP or G-SP of FIG. 4). Furthermore, the light (L4 of FIG. 4) reflected and generated from the adjacent subpixel (R-SP or G-SP of FIG. 4) is reflected and extracted to the outside, thereby further improving light extraction efficiency of the OLED display device 100 (of FIG. 3).

In the above description, it has been described as an example that one unit pixel (P in FIG. 3) includes only the red, green, and blue subpixels (R-SP, G-SP, and B-SP of FIG. 3), but a white subpixel may be further included in one unit pixel (P in FIG. 3). A white color filter may be separately disposed in the white subpixel, or white light implemented from the organic light emitting layer (113 in FIG. 4) may be directly transmitted to implement white light.

In addition, the red, green, and blue color filters (106a, 106b and 106c of FIG. 3) may be omitted in the subpixels (R-SP, G-SP, and B-SP of FIG. 3), and a red color light, a green color light, and a blue color light may be implemented from the organic light emitting layers (113 of FIG. 3) disposed in the subpixels (R-SP, G-SP, and B-SP of FIG. 3).

The organic light emitting layers (113 of FIG. 3) disposed in the subpixels (R-SP, G-SP, and B-SP of FIG. 3) may have various thicknesses according to colors to be implemented.

As described above, according to the present disclosure, since a reflective barrier having a reflective side surface which is inversely tapered is disposed to correspond to a non-emission region defined along an edge of each subpixel, among light emitted from each of the subpixels, light traveling to the non-emission region can be reflected and extracted to the outside of a substrate, thereby improving light extraction efficiency of an OLED display device.

In addition, it is possible to minimize light leakage generated due to light being reflected from the adjacent subpixel. Furthermore, light reflected and generated from the adjacent subpixel can be reflected and extracted to the outside, thereby further improving the light extraction efficiency of the OLED display device.

The present disclosure is not limited to the above-described embodiments, and it will be apparent to those skilled in the art that various modifications and variations can be made in the present disclosure without departing from the spirit or scope of the disclosure.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. An organic light emitting diode display, comprising:
   a substrate having a plurality of subpixels, a driving thin film transistor is provided in each of the subpixels, each of the subpixels including an emission region and a non-emission region defined along an edge of the emission region;
   a reflective barrier disposed on the driving thin film transistor, the reflective barrier disposed to correspond to the non-emission region and including a reflective side surface, the reflective barrier having a height between an upper surface and a lower surface and having a width that decreases along the height from the upper surface to the lower surface;
   an overcoat layer disposed on and contacting the reflective barrier; and
   a light emitting diode including a first electrode, that is disposed on the overcoat layer and the reflective barrier and is in contact with the overcoat layer, an organic light emitting layer, and a second electrode, the organic light emitting layer and the second electrode being sequentially disposed on the first electrode,
   wherein the overcoat layer is disposed between the reflective barrier and the first electrode in a vertical direction, and wherein the reflective barrier is disposed between the first electrode and the substrate in the vertical direction, and
   wherein light emitted from the organic light emitting layer passes through the first electrode and the substrate having the driving thin film transistor.

2. The organic light emitting diode display of claim 1, wherein the reflective barrier has a quadrangular frame shape formed along the edge of the emission region, and including side surfaces formed as the reflective side surface, and the upper surface formed to connect the side surfaces,
   wherein a reflective layer is provided on the side surfaces and the upper surface.

3. The organic light emitting diode display of claim 2, wherein a cross section of the reflective barrier has at least one of an inverse trapezoidal shape or an inverse triangular shape of which a width is gradually increased moving away from the substrate.

4. The organic light emitting diode display of claim 1, wherein an inverse taper angle defined by the substrate and the reflective side surface is greater than 45° and less than 90°.

5. The organic light emitting diode display of claim 1, wherein the first electrode is disposed in each of the subpixels, and a bank is disposed along an edge of the first electrode,
   wherein a width of the reflective barrier is less than a width of the bank.

6. The organic light emitting diode display of claim 1, wherein the plurality of subpixels include a red subpixel including a red color filter provided in the emission region, a green subpixel including a green color filter provided in the emission region, and a blue subpixel including a blue color filter provided in the emission region.

7. The organic light emitting diode display of claim 6, wherein the driving thin film transistor provided in each of the subpixels includes a semiconductor layer, a gate insulating film disposed on an upper portion of the semiconductor layer, a gate electrode disposed on an upper portion of the gate insulating film, a first interlayer insulating film disposed on an upper portion of the gate electrode, and source and drain electrodes disposed on an upper portion of the first interlayer insulating film,
- wherein the reflective barrier and the red, green, and blue color filters are disposed on an upper portion of a second interlayer insulating layer disposed on the source and drain electrodes.

8. The organic light emitting diode display of claim 1, wherein a reflective layer is disposed on the reflective barrier.

9. The organic light emitting diode display of claim 5, wherein the bank is disposed on the reflective barrier and the first electrode.

10. An organic light emitting diode display, comprising:
- a substrate having a plurality of subpixels, each of the subpixels including an emission region and a non-emission region defined along an edge of the emission region;
- a reflective barrier disposed to correspond to the non-emission region and including a reflective side surface, the reflective barrier having a height between an upper surface and a lower surface and having a width that decreases along the height from the upper surface to the lower surface;
- an overcoat layer disposed on and contacting the reflective barrier; and
- a light emitting diode including a first electrode that is disposed on the overcoat layer and is in contact with the overcoat layer, an organic light emitting layer, and a second electrode, the organic light emitting layer and the second electrode being sequentially disposed on the first electrode,
- wherein the reflective side surface of the reflective barrier includes a plurality of side surfaces, and
- a reflective layer includes a tail that is disposed on at least two side surfaces of the reflective barrier, the tail disposed adjacent to the lower surface of the reflective barrier.

* * * * *